US012148852B2

(12) United States Patent
Maeda et al.

(10) Patent No.: US 12,148,852 B2
(45) Date of Patent: Nov. 19, 2024

(54) LIGHT-RECEIVING DEVICE

(71) Applicant: Nippon Telegraph and Telephone Corporation, Tokyo (JP)

(72) Inventors: Yoshiho Maeda, Tokyo (JP); Tatsuro Hiraki, Tokyo (JP); Takuma Aihara, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 352 days.

(21) Appl. No.: 17/785,620

(22) PCT Filed: Dec. 17, 2019

(86) PCT No.: PCT/JP2019/049363
§ 371 (c)(1),
(2) Date: Jun. 15, 2022

(87) PCT Pub. No.: WO2021/124441
PCT Pub. Date: Jun. 24, 2021

(65) Prior Publication Data
US 2023/0011341 A1    Jan. 12, 2023

(51) Int. Cl.
*H01L 31/105* (2006.01)
*G02B 6/136* (2006.01)
*H01S 5/026* (2006.01)
*G02B 6/12* (2006.01)
*G02B 6/122* (2006.01)

(52) U.S. Cl.
CPC ........... *H01L 31/105* (2013.01); *G02B 6/136* (2013.01); *H01S 5/0262* (2013.01); *G02B 2006/12061* (2013.01); *G02B 2006/12078* (2013.01); *G02B 2006/12121* (2013.01); *G02B 6/1228* (2013.01)

(58) Field of Classification Search
None
See application file for complete search history.

(56) References Cited

U.S. PATENT DOCUMENTS 8,809,906 B2 * 8/2014 Zhu ................ H01L 31/105
 438/479
2002/0146196 A1 * 10/2002 Shirane ............. B82Y 20/00
 385/125

(Continued)

OTHER PUBLICATIONS

Baumgartner, Y. et al., "CMOS-Compatible Hybrid III-V/Si Photodiodes Using a Lateral Current Collection Scheme," ECOC, Sep. 23, 2018, 3 pages.

(Continued)

*Primary Examiner* — Jerry Rahll
(74) *Attorney, Agent, or Firm* — Slater Matsil, LLP

(57) ABSTRACT

A light receiving device includes, on a substrate, a Si waveguide core provided in a dielectric layer, a first i-type waveguide clad, an i-type core layer, a second i-type waveguide clad, p-type layers disposed on one side of a side surface of a layered structure in a light waveguide direction, the layered structure including the first i-type waveguide clad, the i-type core layer, and the second i-type waveguide clad, n-type layers disposed on the other side, and an electrode on a surface of each of the n-type layers. A width of the Si waveguide core is set to be able to suppress absorption of light in a vicinity of an input edge of the i-type core layer.

16 Claims, 17 Drawing Sheets

(56) References Cited

U.S. PATENT DOCUMENTS

| | | | | |
|---|---|---|---|---|
| 2005/0047743 A1* | 3/2005 | Nakaji | ............... | G02B 6/12004 |
| | | | | 257/E31.061 |
| 2009/0302426 A1* | 12/2009 | Mclaughlin | ........... | F01P 3/2285 |
| | | | | 257/E21.352 |
| 2013/0126941 A1* | 5/2013 | Zhu | ....................... | H01L 31/105 |
| | | | | 257/184 |

OTHER PUBLICATIONS

Fujii, T. et al., "Heterogeneously Integrated Lasers using Epitaxially Grown III-V Active Layer on Directly Bonded InP/SiO2/Si Substrate," 2016 IEEE Photonics Conference (IPC), Oct. 2, 2016, 2 pages.

* cited by examiner

LIGHT-RECEIVING DEVICE

CROSS-REFERENCE TO RELATED APPLICATIONS

This patent application is a national phase filing under section 371 of PCT application no. PCT/JP2019/049363, filed on Dec. 17, 2019, which application is hereby incorporated herein by reference in its entirety.

TECHNICAL FIELD

The present invention relates to optical communication technology and a light receiving device used therefor.

BACKGROUND

With an increase in optical communication traffic, high speed and miniaturization of optical transceivers, low power consumption, and low cost have been required. Regarding the miniaturization and a reduction in cost of optical transceivers, optical circuits including optical filters and modulators as components can also be manufactured at low cost and required to be made smaller.

Silicon photonics (SiPh) has attracted attention in recent years as technology for realizing small optical circuits at low cost and in mass production, and the research and development of SiPh optical circuits are being actively carried out. However, laser light sources using Si and Ge, which are materials mainly used in SiPh, are still in the process of research and development, and no reports have been made with sufficient performance. For this reason, in a case where SiPh is used in optical transceivers, it is necessary to integrate light sources using compound semiconductors as materials thereof.

As a light source integration method, hybrid mounting after chipping, a method of mounting a laser light source chip on an SiPh optical circuit in a wafer state, a method of forming a laser after bonding an SiPh wafer and a compound semiconductor wafer by wafer bonding, and the like have been reported. In particular, as disclosed in NPL 1, it is possible to realize a low threshold current and low power consumption from high light confinement and carrier injection efficiency, and thin film (membrane) type laser light sources that can be integrated at low cost by wafer bonding have attracted attention.

On the other hand, regarding optical receivers, a lateral injection current injection type thin film PD structure shown in FIG. 9 has been proposed in the related art as a photodiode (hereinafter, referred to as a "PD") and an avalanche photodiode (hereinafter, referred to as an "APD") that can be monolithically integrated with a thin film (membrane) type laser.

In the lateral injection current injection type thin film PD structure shown in FIG. 9, a rectangular waveguide structure in which undoped InGaAs (i-InGaAs) having a high refractive index is used as a core and InP is used as a clad is configured. Further, InP on both sides of an InGaAs core is doped as an N-type and a P-type, and a PIN junction is formed. Light is directly absorbed by the InGaAs core while propagating through the rectangular waveguide, and carriers are optically generated. An i-InGaAs core may be a multiple quantum well (MQW) structure as disclosed in NPL 2. In addition, the above-mentioned photodiode can also be used as an APD by applying a high electric field.

CITATION LIST

Non Patent Literature

[NPL 1] T. Fujii et al., "Heterogeneously integrated lasers using epitaxially grown III-V active layer on directly bonded InP/SiO2/Si substrate", IEEE IPC 2016 (2016) 540-541.

[NPL 2] Y. Baumgartner, et al., "CMOS-Compatible Hybrid III-V/Si Photodiodes Using a Lateral Current Collection Scheme", ECOC 2018 (2018) 1-3.

SUMMARY

Technical Problem

As described above, the structure shown in FIG. 9 has been proposed as a thin film type PD and APD that can be monolithically integrated with a thin film type laser light source. In the structure of FIG. 9, light is strongly confined in a waveguide, and thus a large number of carriers are generated in an InGaAs core at an input edge when high power light is input, which can easily produce a spatial charge effect of blocking an internal electric field by the carriers. The blocking of an electric field inside a PIN junction by the spatial charge effect results in a reduction in a drift speed of carriers at a certain applied voltage and a reduction in an operation speed accompanying a reduction in the width of a depletion layer. Thus, in the structure of the related art, an operation speed is reduced under high light input power.

Means for Solving the Problem

In order to solve the above-described problems, a light receiving device according to embodiments of the present invention includes, on a substrate, a dielectric layer, a Si waveguide core provided in the dielectric layer, a first i-type waveguide clad, an i-type core layer formed on the first i-type waveguide clad, a second i-type waveguide clad formed on the i-type core layer, a p-type layer disposed on one side of a side surface of a layered structure in a light waveguide direction, the layered structure including the first i-type waveguide clad, the i-type core layer, and the second i-type waveguide clad, an n-type layer disposed on the other side of the side surface of the layered structure in the light waveguide direction, the layered structure including the first i-type waveguide clad, the i-type core layer, and the second i-type waveguide clad, and an electrode provided on a surface of each of the p-type layer and the n-type layer, with a width of the Si waveguide core being set to enable absorption of light in a vicinity of an input edge of the i-type core layer to be minimized.

Effects of Embodiments of the Invention

According to embodiments of the present invention, it is possible to provide a light receiving device having excellent high speed operation without depending on light input power.

DETAILED DESCRIPTION OF ILLUSTRATIVE EMBODIMENTS

First Embodiment

A light receiving device 100 according to a first embodiment of the present invention will be described with reference to FIGS. 1A to 4.

Configuration of Light Receiving Device

Figure 1A:
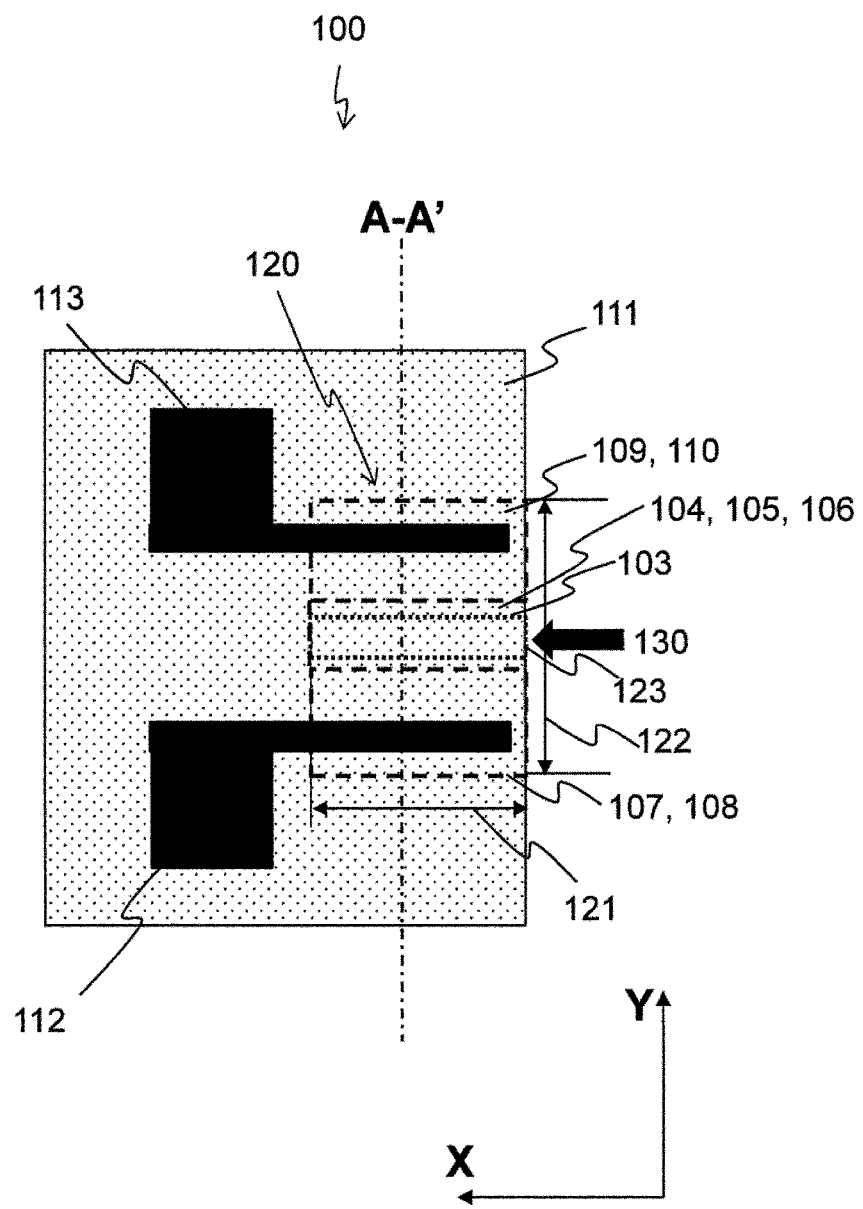
FIG. 1A is a top view of a light receiving device according to a first embodiment of the present invention.
Figure 1B:
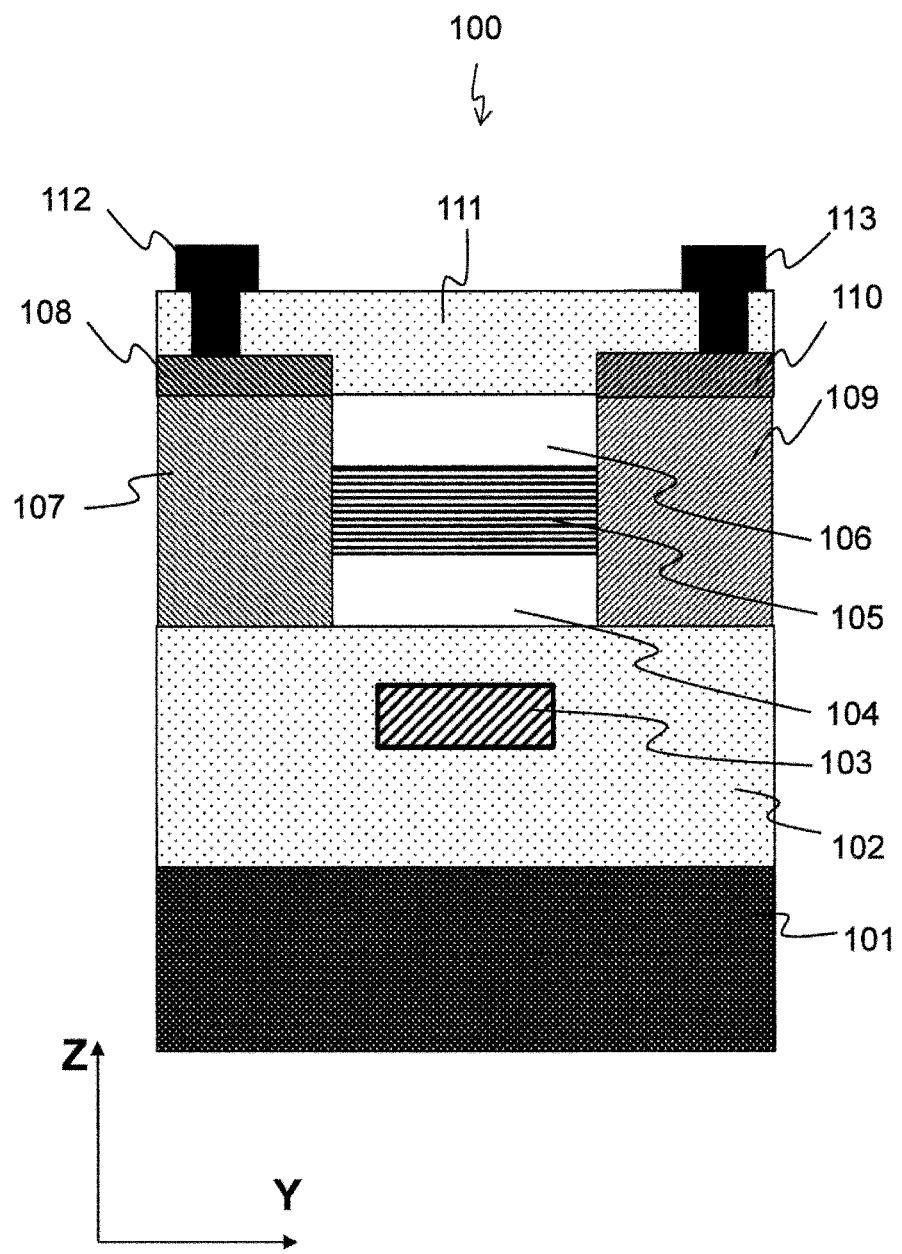
FIG. 1B is a cross-sectional view of the light receiving device according to the first embodiment of the present invention.

FIG. 1A shows a top view of the light receiving device 100 according to the first embodiment of the present invention. In addition, a cross-sectional view taken along A-A' shown in FIG. 1A is shown in FIG. 1B. Hereinafter, a direction in which guided light is incident and propagates (a direction of an arrow X in FIG. 1A) will be referred to as a light waveguide direction or an X direction, and the "length" of the light receiving device according to embodiments of the present invention will be defined in this direction. In addition, a direction parallel to the horizontal plane and perpendicular to the X direction (the direction of an arrow Y in FIGS. 1A and 1B) will be referred to as a Y direction, and the "width" of the light receiving device according to embodiments of the present invention will be defined in this direction. In addition, a direction perpendicular to the horizontal plane and perpendicular to the X direction (the direction of an arrow Z in FIG. 1B) will be referred to as a Z direction, and the "thickness" of the light receiving device according to embodiments of the present invention will be defined in this direction.

The light receiving device 100 includes a Si substrate 101, a dielectric insulating film ($SiO_2$) layer 102, a Si waveguide core 103, a first i-type InP waveguide clad 104, an i-type multiple quantum well (MQW) core 105, a second i-type InP waveguide clad 106, a p-type InP clad 107, a p-type InGaAs contact layer 108, an n-type InP clad 109, an n-type InGaAs contact layer 110, a $SiO_2$), protection film 111, a p-type electrode 112, and an n-type electrode 113.

In the light receiving device 100, a rectangular waveguide structure comprises the first i-type InP waveguide clad 104, the i-type multiple quantum well (MQW) core 105, and the second i-type InP waveguide clad 106. P-type ions and n-type ions are respectively injected into both ends of the rectangular waveguide structure to dope the rectangular waveguide structure, thereby forming the p-type InP clad 107, the p-type InGaAs contact layer 108, the n-type InP clad 109, and the n-type InGaAs contact layer 110 and forming a lateral PIN junction.

Both the p-type InGaAs contact layer 108 and the n-type InGaAs contact layer 110 have a composition that is lattice-matched to InP, and are subjected to high-concentration doping of approximately $1\times10^{19}$ $cm^{-3}$ in order to make an ohmic contact with a metal electrode.

A rectangular Si waveguide structure including the Si waveguide core 103 and using the $SiO_2$ layer 102 as a clad is formed below the rectangular waveguide structure in the PIN junction layer.

In the above-described layered structure, the MQW core 105 has a MQW structure corresponding to a wavelength of 1.55 μm and is constituted by six InGaAs quantum well layers (layer thickness: 6 nm) and seven InGaAsP layers (layer thickness: 10 nm). The width of the MQW core 105 is 600 nm. In addition, the layer thickness of each of the first i-type InP waveguide clad 104 and the second i-type InP waveguide clad 106 is approximately 50 nm.

Here, three to nine InGaAs quantum well layers (layer thickness: 6 nm) and four to ten InGaAsP layers (layer thickness: 10 nm) can be used as the MQW core 105, and it is preferable that the MQW core 105 have a width of equal to or greater than 200 nm and equal to or less than 800 nm and a thickness of equal to or greater than 50 nm and equal to or less than 160 nm. Regarding the compositions and layer thicknesses of InGaAs and InGaAsP forming the MQW core 105, other configurations may be adopted as long as the MQW structure can maintain a crystal quality in response to a wavelength of 1.55 μm.

In addition, it is preferable that a total layer thickness of the MQW core 105, the first i-type InP waveguide clad 104, and the second i-type InP waveguide clad 106 be equal to or greater than 100 nm and equal to or less than 250 nm.

In addition, the thickness of the Si waveguide core 103 may be equal to or greater than 100 nm and equal to or less than 300 nm, and the width of the Si waveguide core 103 can be set to equal to or greater than 0.2 μm and equal to or less than 1 μm as will be described below and may be a width in which guided light propagates in a single mode.

In addition, it is preferable that the thickness of the $SiO_2$ layer 102 between the Si waveguide core 103 and the first i-type InP waveguide clad 104 be equal to or greater than 50 nm and equal to or less than 100 nm.

In addition, a length (hereinafter, referred to as a "PD length") 121 of the PD region 120 in the light receiving device 100 can be set to equal to or greater than 1 μm and equal to or less than 500 μm, and a width 122 thereof can be set to equal to or greater than 30 μm and equal to or less than 50 μm.

Operation Principle of Light Receiving Device

Next, an operation principle of the light receiving device 100 according to the first embodiment of the present invention will be described with reference to FIG. 1A to FIG. 4.

In the light receiving device 100, guided light 130 is incident from an input edge 123 of the Si waveguide core 103 and is guided through the Si waveguide core 103. The guided light is absorbed by the MQW core 105 disposed thereabove, and electron-hole pairs are generated, so that the light receiving device 100 operates as a PD.

FIGS. 2A to 2D show simulation calculation results of a finite difference time domain method (FDTD) of a mode of waveguide light (wavelength: 1.55 μm) in the light receiving device 100 of the present embodiment.

Figure 2A:
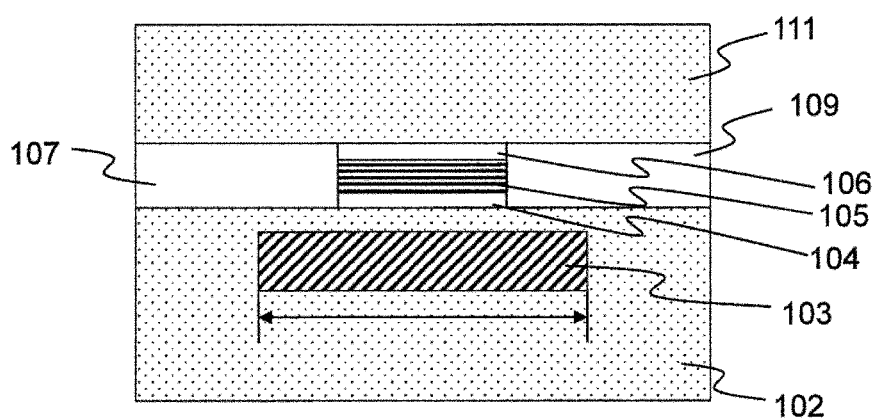
FIG. 2A is a diagram showing a layered structure used to calculate an intensity distribution of guided light (wavelength: 1.55 μm) in the light receiving device according to the first embodiment of the present invention.

FIG. 2A shows a layered structure used for calculation. The layered structure includes the Si waveguide core 103, the first i-type InP waveguide clad 104, the MQW core 105, the second i-type InP waveguide clad 106, the InP dads 107 and 109, and the $SiO_2$ film 111 in the $SiO_2$ layer 102. Each of the first i-type InP waveguide clad 104 and the second i-type InP waveguide clad 106 has a layer thickness of 45 nm, and the MQW core 105 disposed at the center of the InP clad has a width of 600 nm and a layer thickness of no nm. The layer thickness of $SiO_2$ between the Si waveguide core 103 and the InP clad is 100 nm. The layer thickness of the Si waveguide core 103 is set to 220 nm, and the width thereof is changed to 0 μm, 0.5 μm, and 1 μm.

Figure 2B:
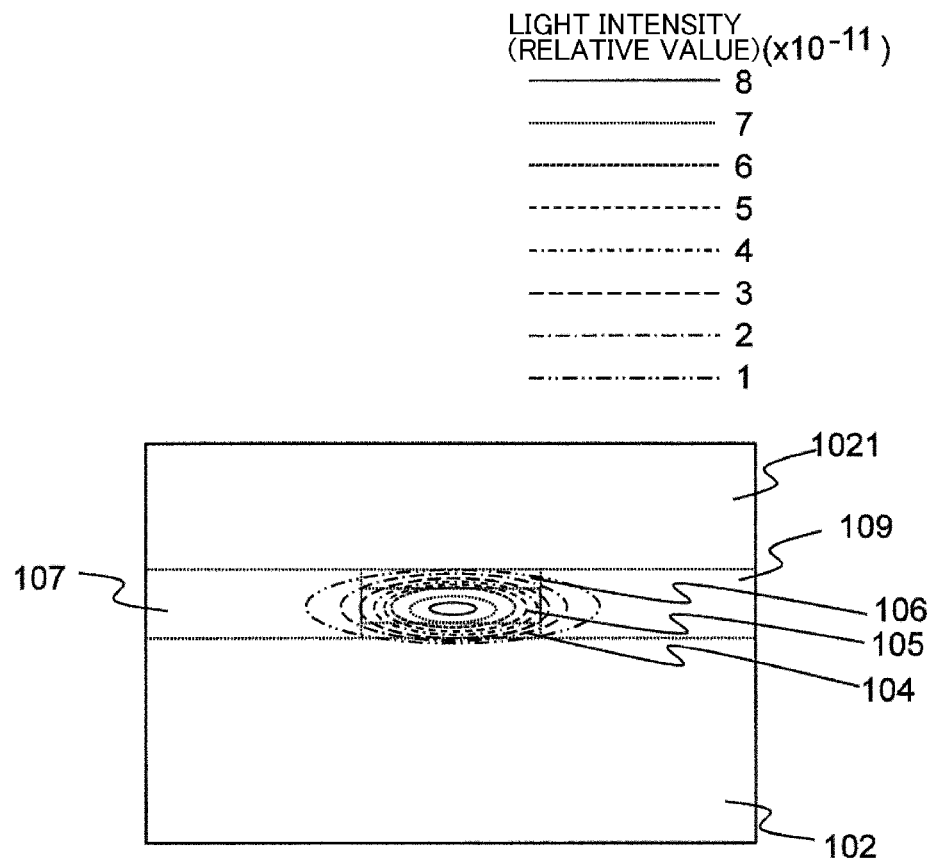
FIG. 2B is a diagram showing an intensity distribution of guided light (wavelength: 1.55 μm) in a layered structure that does not include a Si waveguide core in the light receiving device according to the first embodiment of the present invention.
Figure 2C:
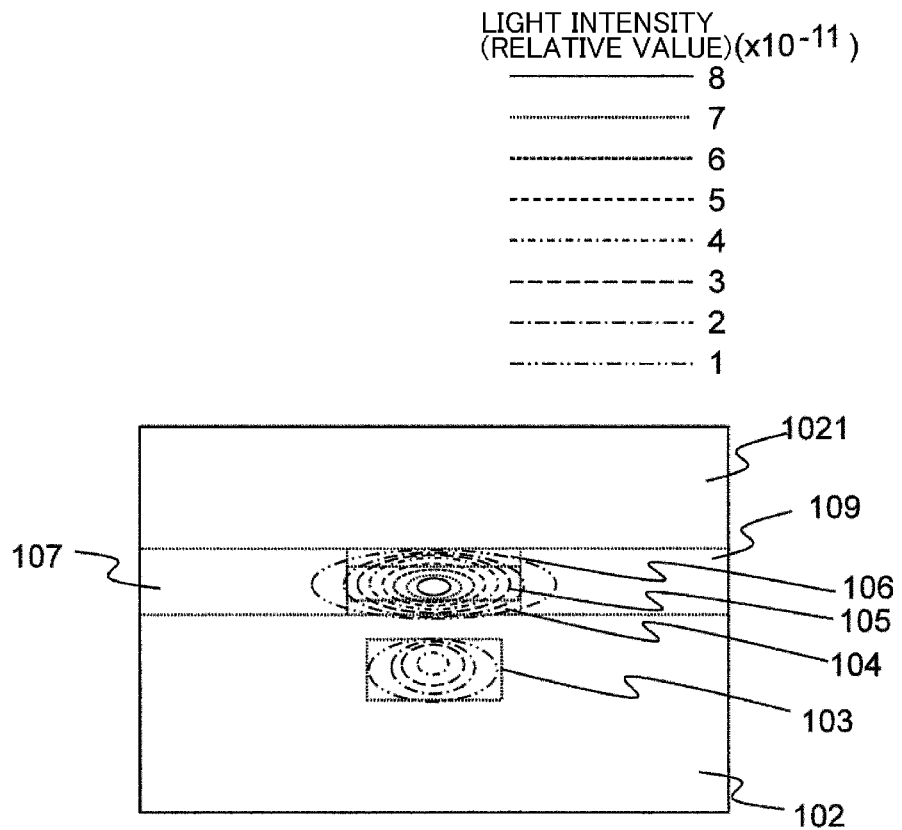
FIG. 2C is a diagram showing an intensity distribution of guided light (wavelength: 1.55 μm) in a layered structure in which the width of a Si waveguide core is 0.5 μm in the light receiving device according to the first embodiment of the present invention.
Figure 2D:
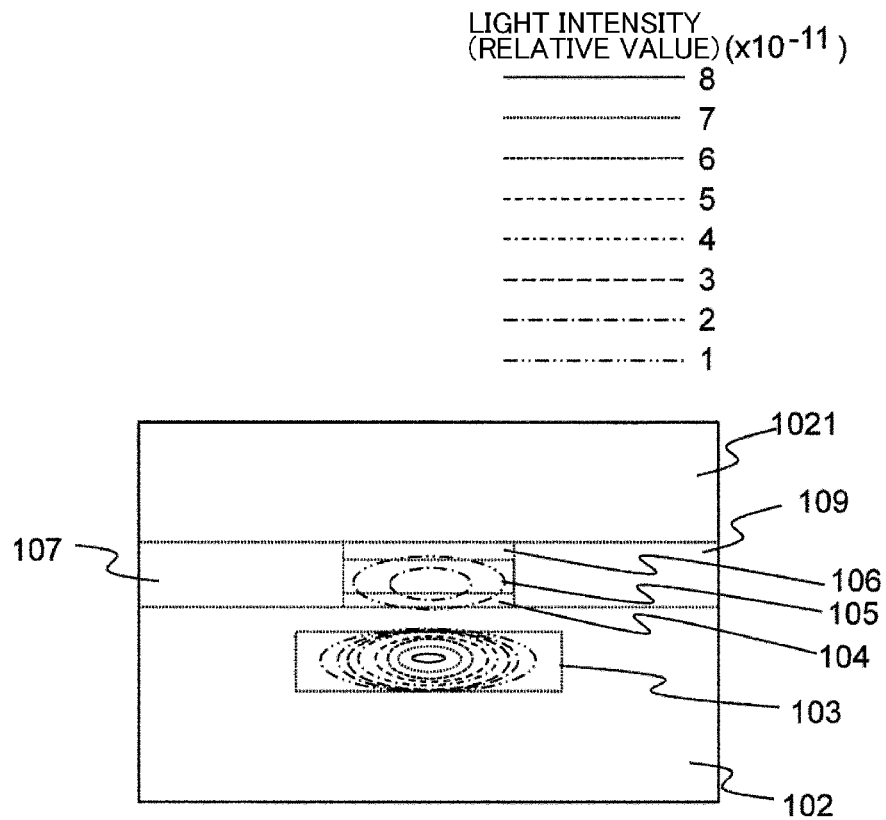
FIG. 2D is a diagram showing an intensity distribution of guided light (wavelength: 1.55 μm) in a layered structure in which the width of a Si waveguide core is 1 μm in the light receiving device according to the first embodiment of the present invention.

Regarding the above-described layered structure, an intensity distribution of guided light in a basic mode was calculated. FIGS. 2B, 2C, and 2D respectively show intensity distributions of guided light in a basic mode when the width of the Si waveguide core 103 is 0 μm, 0.5 μm, and 1 μm.

In a case where the width of the Si waveguide core 103 is 0 μm, that is, in a case where the Si waveguide core 103 is not provided, guided light is distributed to the MQW core 105.

In a case where the width of the Si waveguide core 103 is 0.5 μm, guided light having a relative intensity of approximately $8 \times 10^{-11}$ is distributed to the MQW core 105. On the other hand, guided light having a relative intensity of approximately $5 \times 10^{-11}$ is distributed to the Si waveguide core 103.

Further, in a case where the width of the Si waveguide core 103 is 1 μm, the relative intensity of guided light in the MQW core 105 is reduced to approximately $2 \times 10^{-11}$. On the other hand, the relative intensity of guided light in the Si waveguide core 103 is increased to approximately $8 \times 10^{-11}$.

In this manner, guided light distributed in the MQW core 105 is decreased in amount in association with an increase in the width of the Si waveguide core 103.

A detailed change in the intensity of guided light in the MQW core 105 due to a change in the width of the Si waveguide core 103 will be described with reference to FIGS. 3 and 4.

Figure 3:
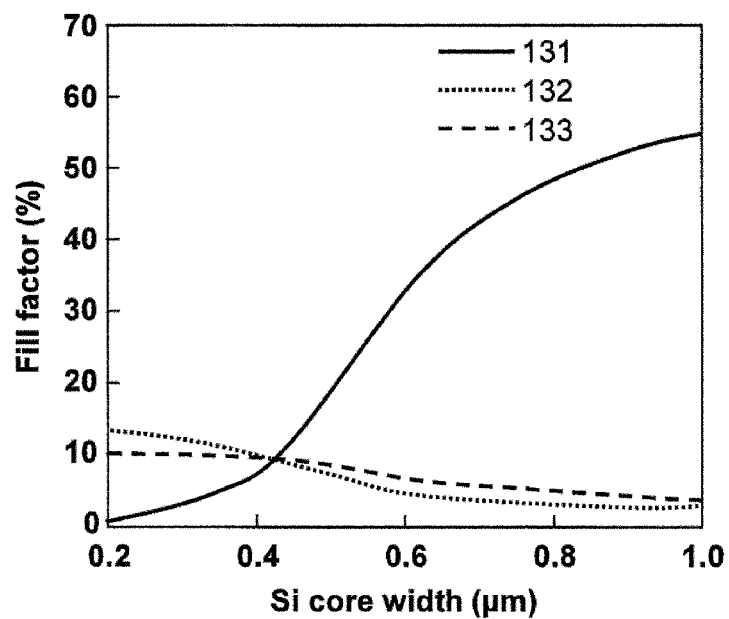
FIG. 3 is a diagram showing the dependence of a light fill factor of each layer in a layered structure on the width of a Si waveguide core layer in the light receiving device according to the first embodiment of the present invention.

FIG. 3 shows the dependence of a light fill factor of each layer in the above-described layered structure on a layer width of the Si waveguide core 103. Light fill factors in the Si waveguide core 103, the InP clad (the first i-type InP waveguide clad 104 and the second i-type InP waveguide clad 106), and the MQW core 105 are indicated by a solid line 131, a dashed line 132, and a dashed line 133, respectively. Here, the light fill factors were calculated as a ratio of an integrated value of a light intensity confined in each layer to an integrated value of the entire basic mode of guided light obtained by the above-described calculation.

With an increase in the width of the Si waveguide core 103, the confinement of light in the Si waveguide core 103 increases, and the confinement of light in the InP waveguide dads 104 and 106 and the MQW core 105 decreases. In particular, light confinement in the MQW core 105 when the width of the Si waveguide core 103 is 0.2 μm is approximately 10%, and light confinement in the MQW core 105 when the width of the Si waveguide core 103 is 1 μm decreases to approximately 4%.

In this manner, the light confinement in the MQW core 105 can be reduced to approximately ½ by increasing the width of the Si waveguide core 103.

Figure 4:
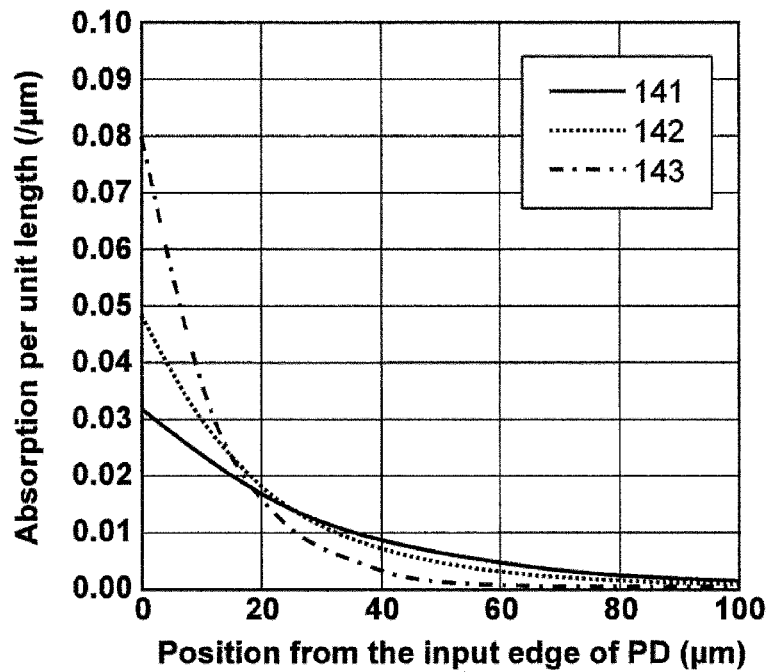
FIG. 4 is a diagram showing the dependence of a rate at which light is absorbed per unit length in a MQW core on a position from an input edge in the light receiving device according to the first embodiment of the present invention.

FIG. 4 shows the dependence of a rate at which light is absorbed per unit length in the MQW core 105 on a position from the input edge 123 in the X direction. Calculation was performed by setting a light absorption coefficient α in the MQW core 105 with respect to light having a wavelength of 1.55 μm to 8000 $cm^{-1}$. In the drawing, the dependences of a rate at which light is absorbed in a case where a light confinement rate (hereinafter, referred to as Γ) for the MQW core 105 is 4% (a case where the width of the Si waveguide core 103 is 0.8 to 1 μm), in a case where Γ is 6% (a case where the width of the Si waveguide core 103 is 0.6 to 0.8 μm), and in a case where Γ is 10% (a case where the width of the Si waveguide core 103 is 0.2 to 0.4 μm) are indicated by a solid line 141, a dashed line 142, and an alternating dotted-dashed line 143.

In a case where Γ is 10% (a case where the width of the Si waveguide core 103 is 0.2 to 0.4 μm) 143, a light absorption rate is approximately 0.08/μm at the input edge 123 and suddenly decreases to a position of 40 μm from the input edge 123.

On the other hand, in a case where Γ is 4% (a case where the width of the Si waveguide core 103 is 0.8 to 1 μm) 141, a light absorption rate is approximately 0.03/μm at the input edge 123 and decreases gradually as compared to a case where Γ is 10% as light propagates into the light receiving device 100 from the input edge 123.

In this manner, as compared to a case where there is no Si waveguide core 103 or the width thereof is 0.2 μm (Γ=10%), light absorption at the input edge 123 of the PD can be reduced to approximately ⅓ by forming a Si waveguide having a width of 1 μm.

As described above, the proportion of guided light confined in the Si waveguide core 103 and the MQW core 105 can be controlled depending on a core width of the Si waveguide.

The width of the Si waveguide core 103 in the light receiving device 100 according to the present embodiment is determined in consideration of the PD length 121. For example, as shown in FIG. 4, light absorption of 141 is great in the case of the width (0.8 to 1.0 μm) of the Si waveguide core 103 in which the PD length 121 (corresponding to a horizontal axis in FIG. 4) is equal to or greater than 30 μm, and a light fill factor Γ of the MQW core 105 is set to 4%. Thus, when the PD length 121 is equal to or greater than 30 μm, it is effective to set the width of the Si waveguide core 103 to 0.8 to 1.0 μm.

On the other hand, when the PD length 121 is less than 30 μm, light absorption in the entire region of the PD is great in the case of the width (0.2 to 0.8 μm) of the Si waveguide core 103 in which the light fill factor Γ of the MQW core 105 is set to 6% to 10%. Considering that light absorption at the input edge 123 of the PD is great when the light fill factor Γ of the MQW core 105 is 10% (when the width of the Si waveguide core 103 is 0.2 to 0.4 μm), it is effective to set the width of the Si waveguide core 103 to approximately 0.6 μm in which the light fill factor Γ of the MQW core 105 is set to approximately 6% when the PD length 121 is less than 30 μm.

In this manner, in order to improve characteristics of the light receiving device 100 of the present embodiment, it is important to adopt a configuration in which light absorption at the input edge 123 which is related to the operation speed of the light receiving device 100 depending on the width of the Si waveguide core 103 is suppressed, and the amount of light absorbed by the MQW core 105 which is related to the sensitivity of the light receiving device wo depending on the PD length 121 is secured.

As described above, according to the present embodiment, sudden light absorption at the input edge 123 of the PD can be suppressed, and thus it is possible to suppress the occurrence of electric field shielding due to a spatial charge effect to prevent an operation speed from being lowered when high optical power is input.

Method of Manufacturing Light Receiving Device

First, a layered structure of i-type InP, a MQW, and i-type InP is crystal-grown on an InP substrate using known epitaxial crystal growth technology.

On the other hand, a Si waveguide layer is laminated on an oxide film of the Si substrate 101 having the oxide film on the surface thereof and is processed to form the Si waveguide core 103, and then a SiO₂ layer is laminated thereon.

Next, crystal on the InP substrate having i-type InP as a lower surface and the Si substrate having the SiO₂ layer as an upper surface are wafer-bonded by joining the surface of the i-type InP and the surface of the SiO₂ layer together by using wafer bonding technology.

Next, the InP substrate is removed using known substrate polishing technology and wet etching technology.

Next, the layered structure of the i-type InP, the MQW, and the i-type InP are processed to a predetermined width by known photolithography and dry etching technology to form the first i-type InP waveguide clad 104, the MQW core 105, and the second i-type InP waveguide clad 106.

Next, i-type InP and i-type InGaAs are crystal-grown on a surface including a layered structure of the above-described first i-type InP waveguide clad 104, MQW core 105, and second i-type InP waveguide clad 106.

Next, the i-type InP and the i-type InGaAs that are grown on the layered structure of the first i-type InP waveguide clad 104, the MQW core 105, and the second i-type InP waveguide clad 106 are removed by known photolithography and dry etching technology.

Next, a SiO₂ film is deposited on the surface by sputtering technology, and then SiO₂ in a region for forming an n electrode is removed by known photolithography and dry etching technology to expose the i-type InGaAs.

Next, an n-type dopant is ion-injected into the i-type InP and the i-type InGaAs in the region for forming an n electrode to form the n-type InP clad 109 and the n-type InGaAs contact layer 110.

Next, a SiO₂ film is deposited on the surface by sputtering technology again, and then SiO₂ in a region for forming a p electrode is removed by known photolithography and dry etching technology to expose the i-type InGaAs.

Next, a p-type dopant is ion-injected into the i-type InP and the i-type InGaAs in the region for forming a p electrode to form the p-type InP clad 107 and the p-type InGaAs contact layer 108.

Next, alloying is performed.

Next, the SiO₂ film 111 for surface protection is deposited by sputtering technology in order to form an electrode.

Next, in order to form an electrode, an opening is provided in a portion of the above-mentioned SiO₂ film 111 for surface protection by dry etching.

Finally, an electrode material is vapor-deposited by known vacuum deposition technology to form the p-type electrode 112 and the n-type electrode 113. As the electrode material, an alloy of titanium, platinum, and gold and gold are used. In this manner, the light receiving device 100 of the first embodiment is manufactured.

Second Embodiment

Next, a second embodiment of the present invention will be described.

Figure 5A:
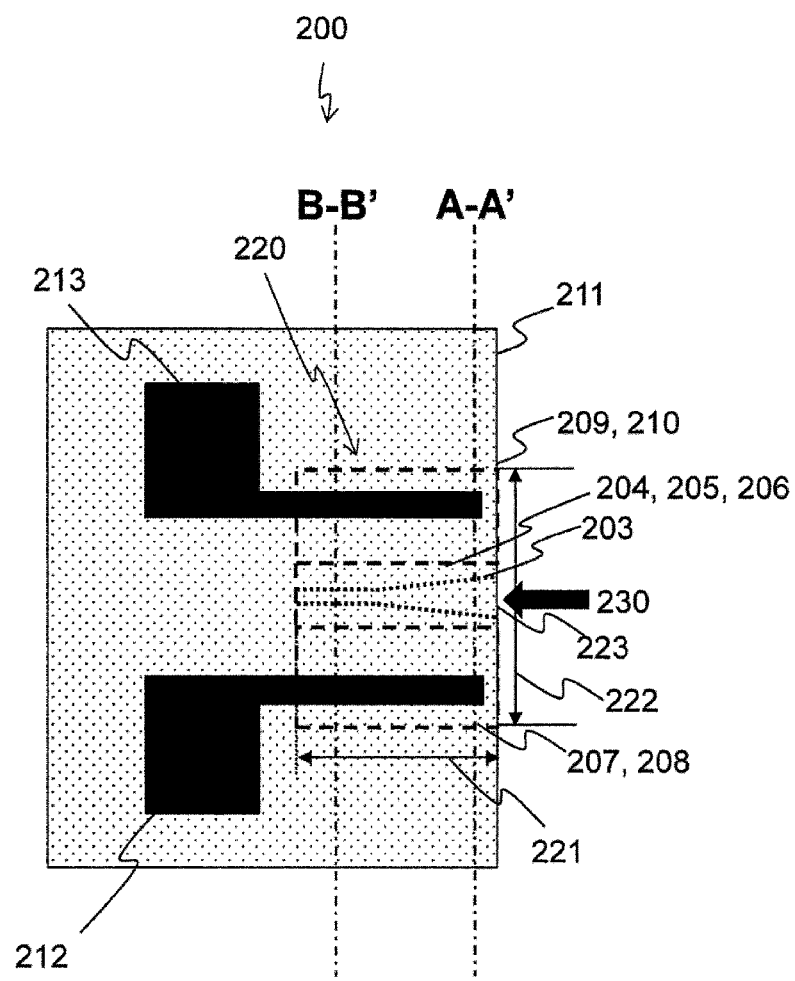
FIG. 5A is a top view of a light receiving device according to a second embodiment of the present invention.

FIG. 5A shows a top view of a light receiving device 200 according to the second embodiment of the present invention. In addition, a cross-sectional view taken along A-A' shown in FIG. 5A is shown in FIG. 5B, and a cross-sectional view taken along B-B' shown in FIG. 5A is shown in FIG. 5C.

A configuration of the light receiving device 200 according to the present embodiment is substantially the same as the configuration of the light receiving device 100 according to the first embodiment, but there is a difference in that a Si waveguide core 203 is modulated in a tapered shape in the light receiving device 200, that is, the Si waveguide core 203 is changed.

As described in the first embodiment, the proportion of light confined in an i-type InGaAs layer can be adjusted by the width of the Si waveguide core 203. Further, in a case where the width of the Si waveguide core 203 is fixed, the absorption of light changes exponentially with respect to its propagation direction.

Figure 5B:
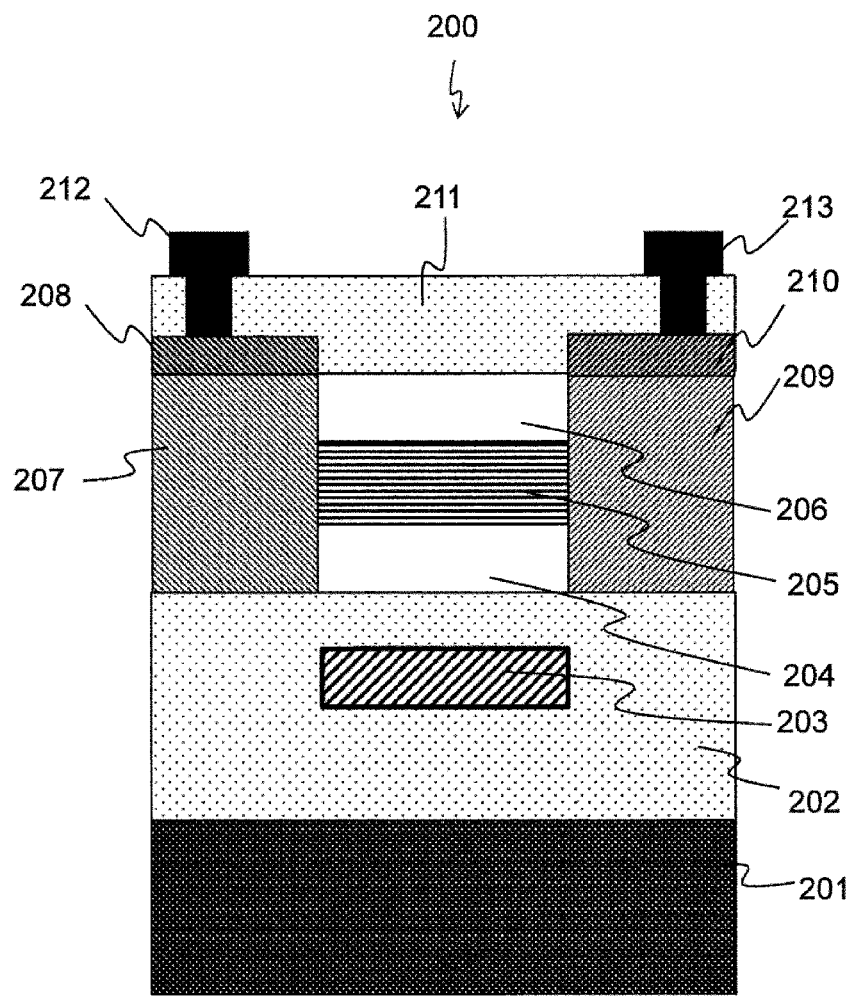
FIG. 5B is a cross-sectional view (A-A') of the light receiving device according to the second embodiment of the present invention.
Figure 5C:
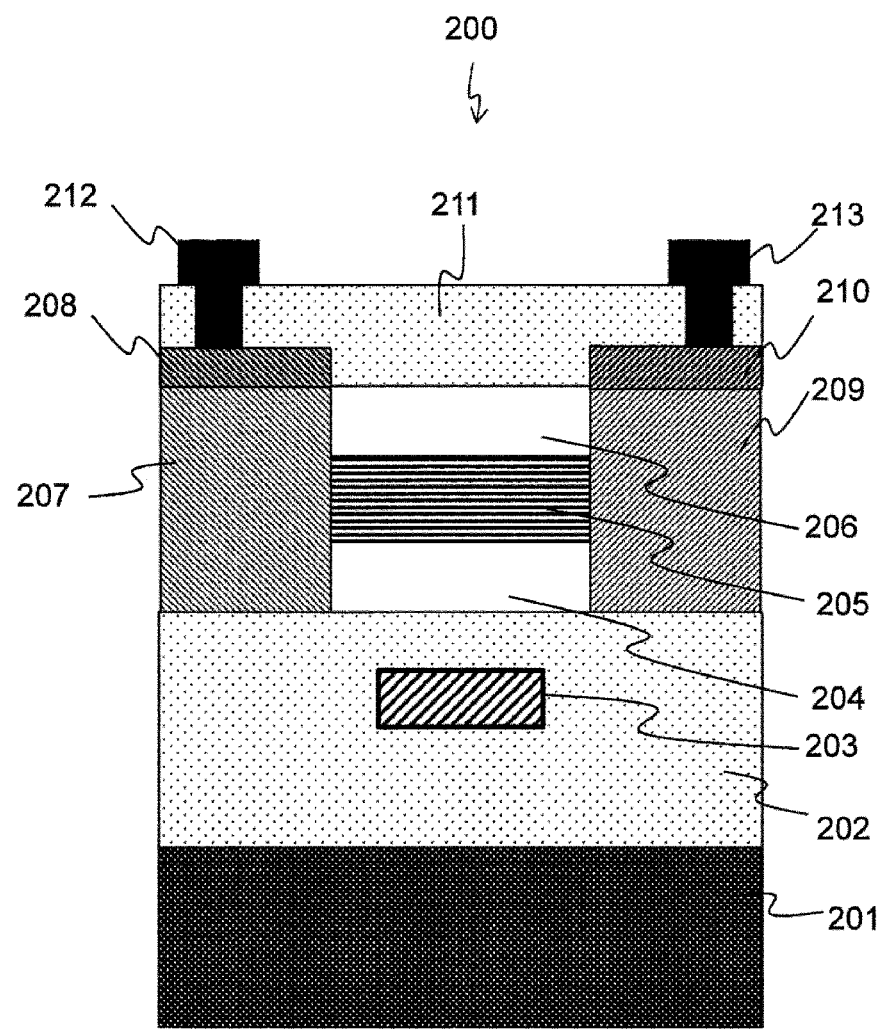
FIG. 5C is a cross-sectional view (B-B') of the light receiving device according to the second embodiment of the present invention.

In the light receiving device 200 according to the present embodiment, as shown in FIGS. 5A, 5B, and 5C, modulation is performed so that the width of the Si waveguide core 203 on an input edge 223 side is increased, and the width of the Si waveguide core 203 is reduced in a direction in which light propagates through the light receiving device 200. In detail, the width of the Si waveguide core 203 is reduced by 20 nm every 1 μm from 1 μm to 0.2 μm in a light propagation direction from the input edge 223. In this case, Γ increases from 2% to 10%.

The width of the Si waveguide core 203 is fixed at 0.2 μm from a position where the width of the Si waveguide core 203 is 0.2 µm (a position distant from the input edge 223 by 40 µm) to a terminal end of the Si waveguide core 203.

Figure 6:
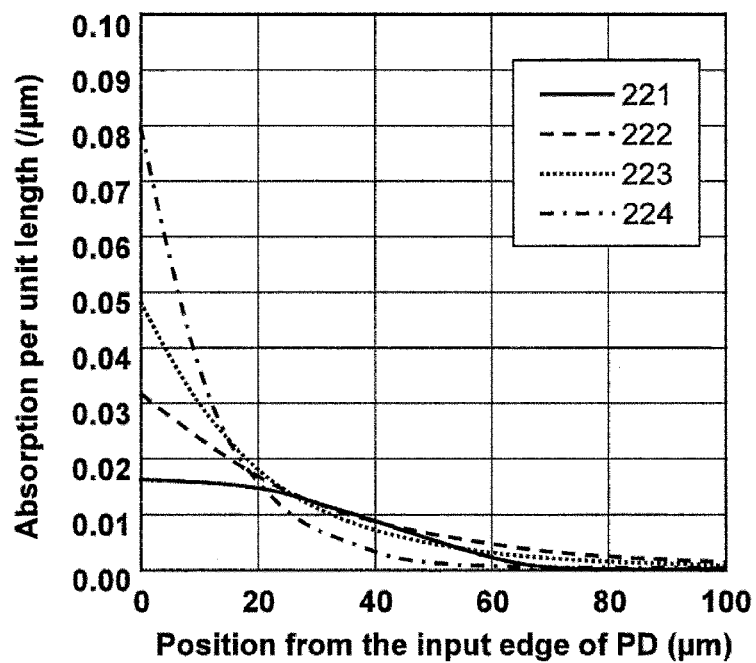
FIG. 6 is a diagram showing the dependence of a rate at which light is absorbed per unit length in a MQW core on a position from an input edge in the light receiving device according to the second embodiment of the present invention.

FIG. 6 shows the dependence of a rate at which light is absorbed per unit length in a MQW core 205 on a position from the input edge 223. Calculation was performed by setting a light absorption coefficient α in the MQW core 205 with respect to light having a wavelength of 1.55 µm to 8000 cm$^{-1}$. A case where the width of the Si waveguide core 203 in the present embodiment is modulated (Γ is increased from 2% to 10%) is indicated by a solid line 221. In addition, for comparison, cases where the width of the Si waveguide core 203 is fixed, and Γ is 4%, 6%, and 10% are indicated by a broken line 222, a dashed line 223, and an alternating dotted-dashed line 224.

In a case where the width of the Si waveguide core 203 is fixed, the absorption of light by the input edge 223 can be reduced to approximately ⅓ in a case where Γ is 4%, as compared to a case where Γ is 10% as described in the first embodiment, but the absorption of light in the vicinity of the input edge 223 is increased.

On the other hand, in a case where the width of the Si waveguide core 203 is modulated, the absorption of light by the input edge 223 can be reduced to approximately ⅕ as compared to a case where the width of the Si waveguide core 203 is fixed and Γ is 10%. Further, the absorption of light is substantially fixed in a light propagation direction, and a sudden increase in light absorption by the input edge 223 can be suppressed.

In this manner, the width of the Si waveguide core 203 in the present embodiment is modulated, and thus it is possible to suppress a sudden increase in light absorption by the input edge 223 while maintaining a total amount of light absorbed by the MQW core 205 which is an absorption layer of a PD and to suppress the absorption of light in the PD.

In the present embodiment, a width is modulated from the input edge 223 of the Si waveguide core 203 in the present embodiment to a predetermined position, and a fixed width is set from the predetermined position to a terminal end. However, a width may be modulated in the entire region of the Si waveguide core 203, or a width may be modulated at only an intermediate position of the Si waveguide core 203. In other words, a structure in which the width of at least a portion of the Si waveguide core 203 increases toward a light waveguide direction may be adopted.

The light receiving device 200 of the present embodiment can be manufactured by substantially the same manufacturing method as that of the light receiving device of the first embodiment.

As described above, according to the present embodiment, it is possible to suppress the occurrence of electric field shielding due to a spatial charge effect to prevent an operation speed from being lowered when high optical power is input.

Third Embodiment

Next, a third embodiment of the present invention will be described.

A light receiving device 300 according to the present embodiment is configured such that a spot size conversion unit 314 of Si and InP is disposed at an input edge of the light receiving device according to the first embodiment or the second embodiment.

Figure 7A:
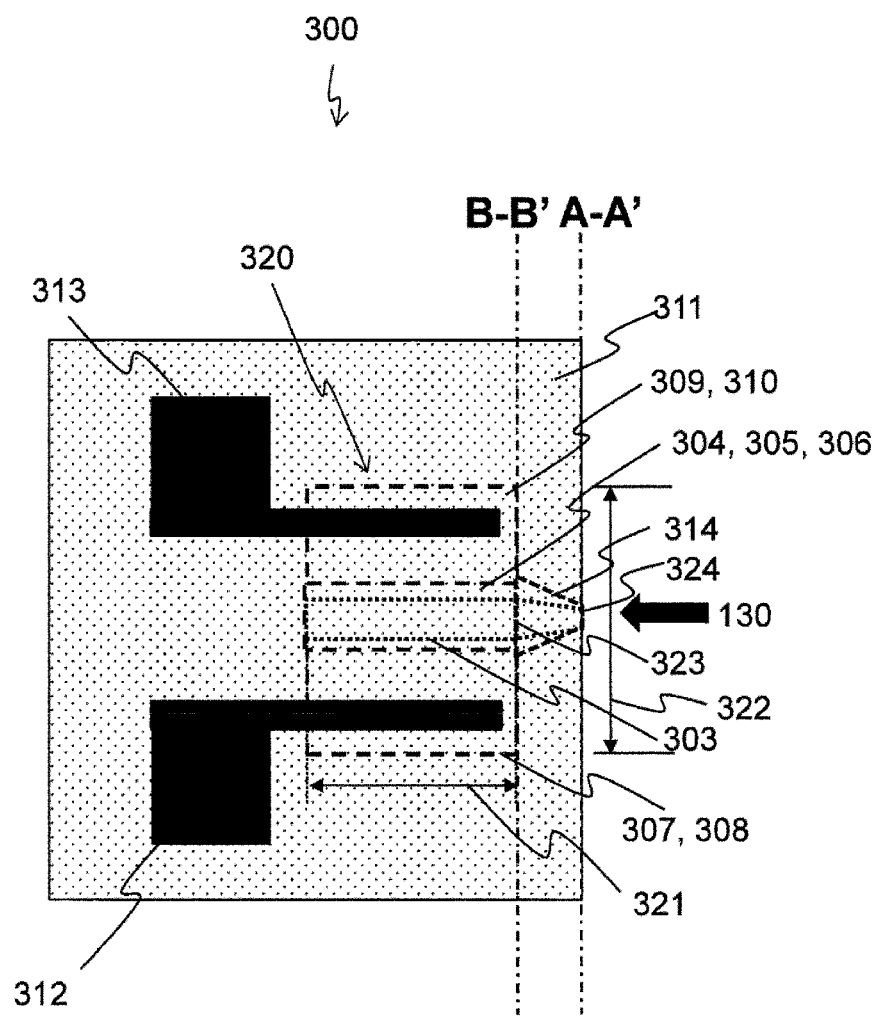
FIG. 7A is a top view of a light receiving device according to a third embodiment of the present invention.
Figure 7B:
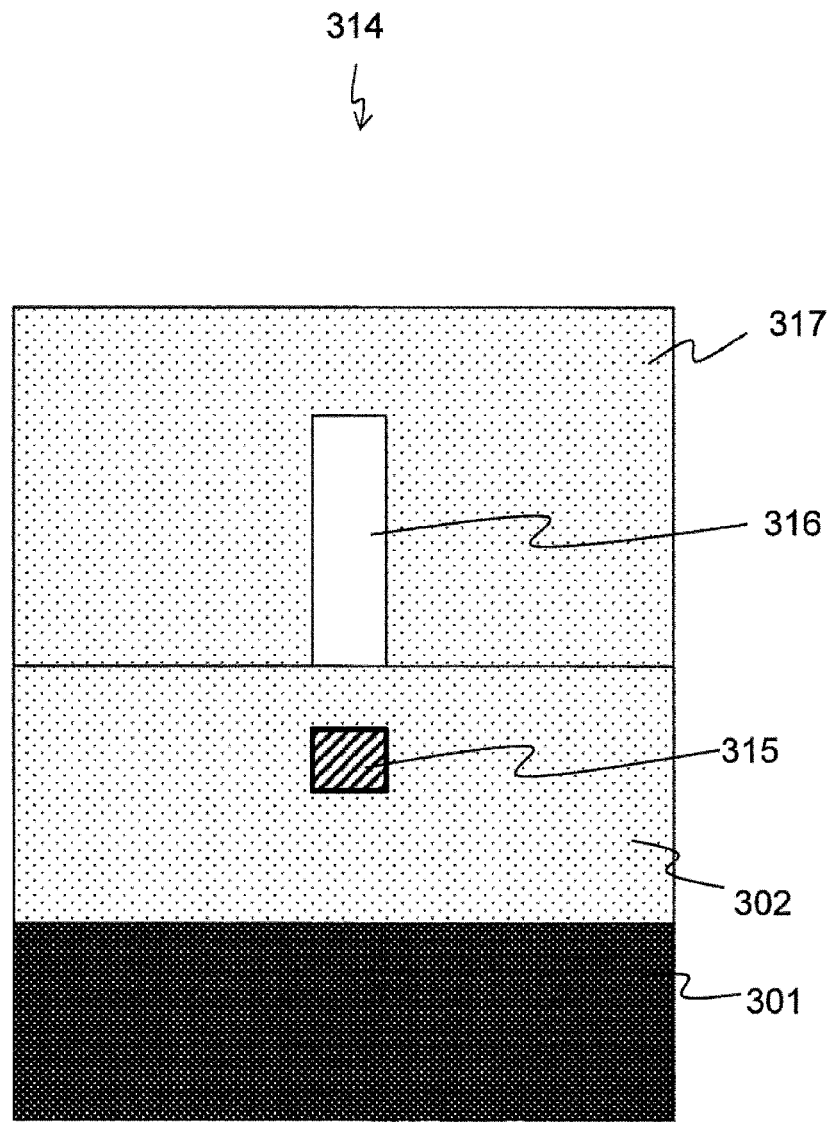
FIG. 7B is a cross-sectional view (A-A') of the light receiving device according to the third embodiment of the present invention.
Figure 7C:
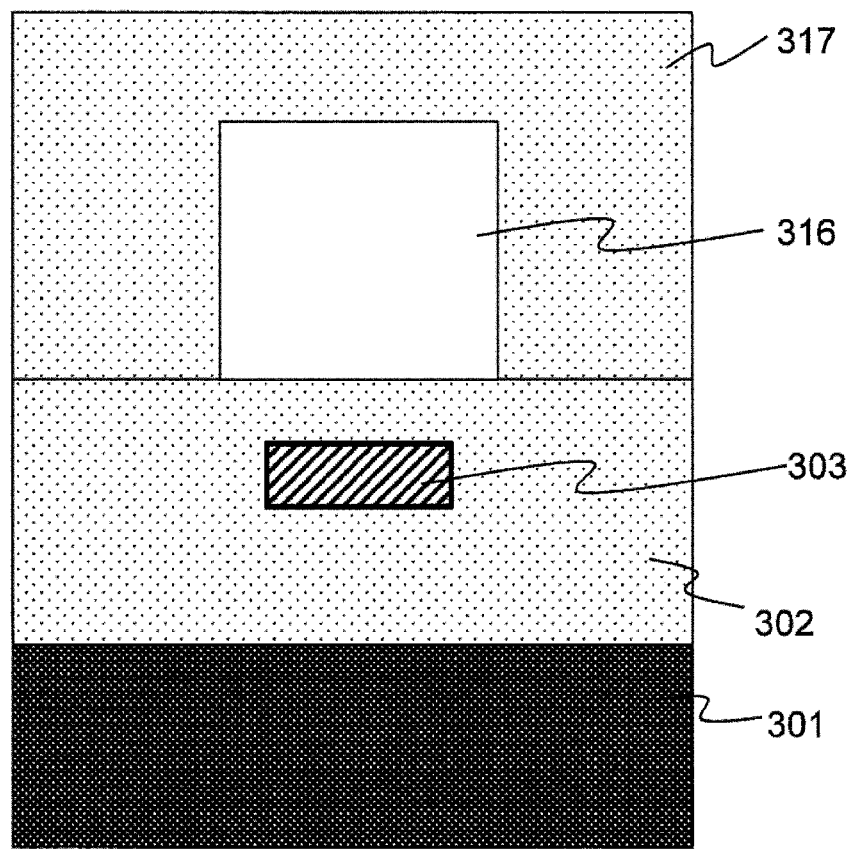
FIG. 7C is a cross-sectional view (B-B') of the light receiving device according to the third embodiment of the present invention.

FIG. 7A shows a top view of the light receiving device 300 according to the third embodiment of the present invention. In addition, a cross-sectional view of an input edge 324 taken along A-A' shown in FIG. 7A is shown in FIG. 7B, and a cross-sectional view of a coupling edge 323 between the spot size conversion unit 314 and a PD region 320 which is taken along B-B' shown in FIG. 7A is shown in FIG. 7C.

In the spot size conversion unit 314, an InP clad 316 is disposed in a SiO$_2$ layer 317 with a SiO$_2$ layer 302 interposed above a Si waveguide 315. The length of the spot size conversion unit 314 is 50 µm, and the Si waveguide 315 has a structure in which the width thereof increases from the input edge 324 to the coupling edge 323 with the PD region 320. The width thereof may be increased from 0.44 µm to 1 µm, and the thickness thereof may be equal to or greater than 100 nm and equal to or less than 300 nm. In addition, the width of the InP clad 316 may be increased from 0.1 µm to 1.5 µm, and the thickness thereof may be equal to or greater than 100 nm and equal to or less than 250 nm.

In the light receiving device 300, guided light is incident on the spot size conversion unit 314 from the outside, and a spot size of guided light is converted to a size suitable for a waveguide structure of the light receiving device 300. The guided light is incident on the PD region 320. The spot size conversion unit suppresses a light loss of guided light and allows the guided light to be incident on the PD region 320.

In the PD region 320, guided light is adiabatically converted into a hybrid mode in a loading structure of the Si waveguide core 303 and the MQW core 305, and is absorbed by the MQW core 305 while propagating through the PD region 320. Then, electron-hole pairs are generated by absorbed light, and thus the light receiving device 300 operates as a PD.

The light receiving device 300 of the present embodiment can be manufactured by using known butt joint crystal growth in combination with a method of manufacturing the light receiving device of the first embodiment.

Figure 8:
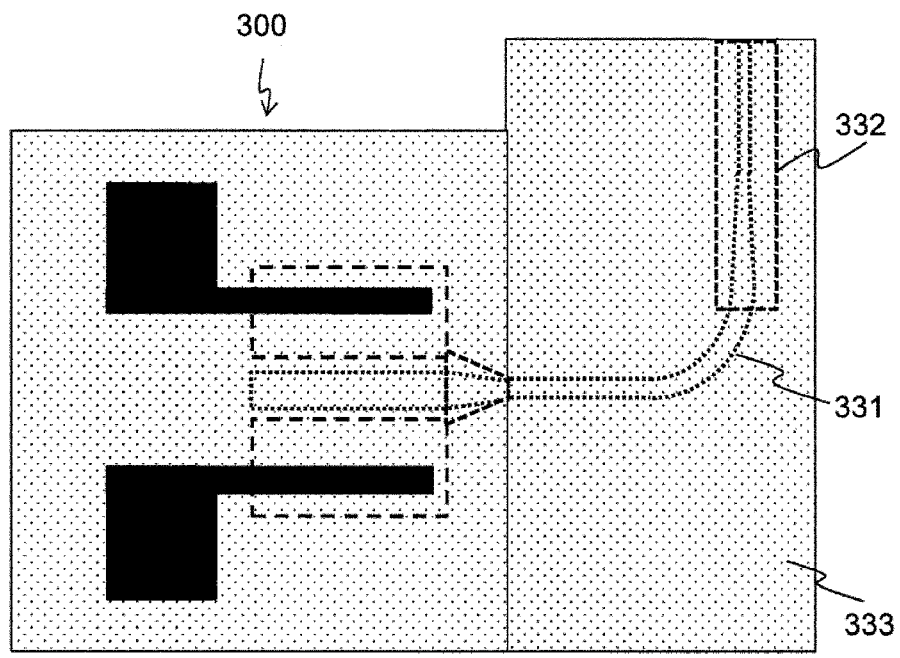
FIG. 8 is a diagram showing an application example of the light receiving device according to the third embodiment of the present invention.
Figure 9:
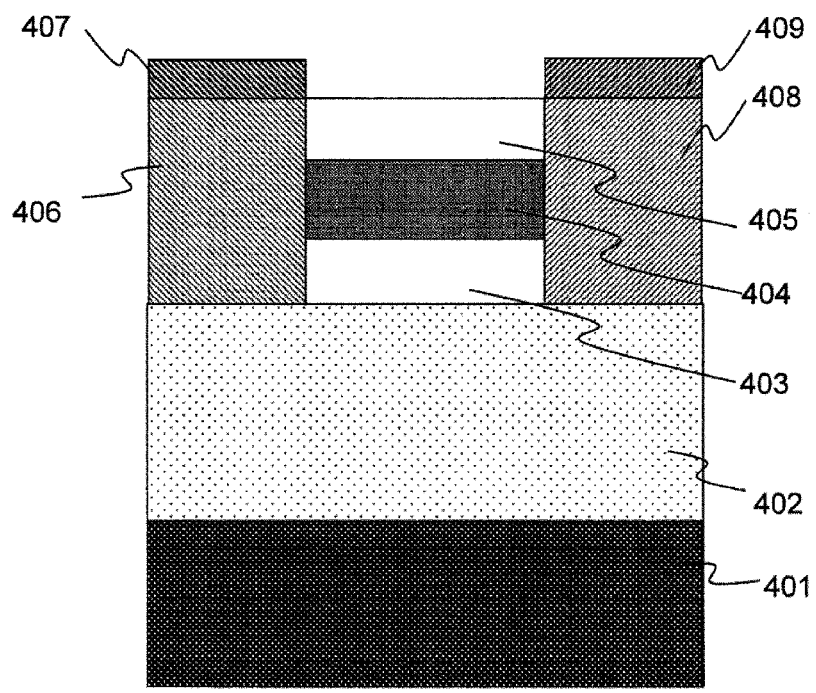
FIG. 9 is a cross-sectional view of a layered structure of a light receiving device of the conventional art.

The light receiving device 300 of the present embodiment is combined with a Si waveguide 331 in a SiO$_2$ layer 333 including a spot size conversion unit 332 as shown in FIG. 8, and thus it is possible to allow guided light to be incident on the PD region 320 with higher efficiency.

In the light receiving devices according to the first to third embodiments of the present invention, the width of a Si waveguide core is set to be able to suppress the absorption of light in the vicinity of an input edge of a MQW core layer.

In this manner, a Si waveguide core is formed below a lateral current injection type waveguide PD, and the width of the Si waveguide core is appropriately controlled. Thus, it is possible to alleviate strong light absorption at an input edge and to prevent an operation speed accompanying the occurrence of a spatial charge effect from being lowered.

The light receiving devices according to the first to third embodiments of the present invention can be integrated with a thin film (membrane) type laser light source (for example, NPL 1).

In the embodiments of the present invention, a MQW has been used as an absorption layer, but an InGaAs or an InGaAsP having a composition corresponding to the same wavelength may be used.

In the embodiments of the present invention, it is possible to cope with not only a wavelength in a long wavelength band but also light having other wavelengths by using not only an InP-based compound crystal but also other materials such as a GaAs-based compound crystal and a nitride-based compound crystal.

In the embodiments of the present invention, Si is used for a substrate to form an oxide film (SiO$_2$) on Si, but InP may be used for the substrate. For the substrate, other semiconductor substrates such as an SOI substrate and a GaAs substrate, a sapphire substrate, and the like can also be used.

In the embodiments of the present invention, $SiO_2$ is used as a dielectric insulating film, but other dielectrics such as silicon nitride (SiNx) may be used.

In the embodiments of the present invention, the wavelength of light to be input is set to 1.55 µm, but it is also possible to cope with wavelengths in other long wavelength bands such as 1.3 µm. In this case, an absorption layer using a MQW core or the like may be configured to have a composition corresponding to a wavelength in another long wavelength band such as 1.3 µm.

The dimensions of the components, pails, and the like of the light receiving devices according to the first to third embodiments of the present invention have been described, but the dimensions are not limited thereto and may be dimensions for making the components, parts, and the like function.

INDUSTRIAL APPLICABILITY

Embodiments of the present invention relate to a light receiving device excellent in a high-speed and high-sensitivity operation, and can be applied to devices and systems for optical communication or the like using an optical semiconductor device.

REFERENCE SIGNS LIST

100 Light receiving device 100
101 Si substrate
102 Dielectric insulating film ($SiO_2$) layer
103 Si waveguide core
104 First i-type InP waveguide clad
105 i-type multiple quantum well (MQW) core
106 Second i-type InP waveguide clad
107 p-type InP clad
108 p-type InGaAs contact layer
109 n-type InP clad
110 n-type InGaAs contact layer
111 $SiO_2$ protection film
112 p-type electrode
113 n-type electrode
123 Input edge

The invention claimed is:

1. A light receiving device comprising:
a dielectric layer on a substrate;
a Si waveguide core provided in the dielectric layer and having a width;
a first i-type waveguide clad;
an i-type core layer disposed on the first i-type waveguide clad, wherein the Si waveguide core is configured to suppress absorption of light in a vicinity of an input edge of the i-type core layer;
a second i-type waveguide clad disposed on the i-type core layer;
a p-type layer disposed on a first side of a side surface of a layered structure in a light waveguide direction, the layered structure comprising the first i-type waveguide clad, the i-type core layer, and the second i-type waveguide clad;
an n-type layer disposed on a second side of the side surface of the layered structure in the light waveguide direction; and
an electrode provided on a surface of each of the p-type layer and the n-type layer.

2. The light receiving device according to claim 1, wherein the width of the Si waveguide core is equal to or greater than 0.2 µm and equal to or less than 1 µm.

3. The light receiving device according to claim 1, wherein the width of at least a portion of the Si waveguide core increases toward the light waveguide direction.

4. The light receiving device according to claim 1, wherein a thickness of the Si waveguide core is equal to or greater than 100 nm and equal to or less than 300 nm.

5. The light receiving device according to claim 1, wherein a width of the i-type core layer is equal to or greater than 200 nm and equal to or less than 800 nm.

6. The light receiving device according to claim 1, wherein a thickness of the i-type core layer is equal to or greater than 50 nm and equal to or less than 160 nm.

7. The light receiving device according to claim 1, wherein:
the first i-type waveguide clad and the second i-type waveguide clad comprise i-type InP;
the p-type layer comprises a p-type InP and a p-type InGaAs that is lattice-matched to InP;
the n-type layer comprises an n-type InP and an n-type InGaAs that is lattice-matched to InP; and
the i-type core layer is configured to absorb light in a long wavelength band.

8. The light receiving device according to claim 7, wherein the i-type core layer comprises InGaAs or InGaAsP.

9. A method of forming a light receiving device, the method comprising:
forming a dielectric layer on a substrate;
forming a Si waveguide core in the dielectric layer and having a width;
forming a first i-type waveguide clad;
forming an i-type core layer on the first i-type waveguide clad, wherein the Si waveguide core suppresses absorption of light in a vicinity of an input edge of the i-type core layer;
forming a second i-type waveguide clad on the i-type core layer;
forming a p-type layer on a first side of a side surface of a layered structure in a light waveguide direction, the layered structure comprising the first i-type waveguide clad, the i-type core layer, and the second i-type waveguide clad;
forming an n-type layer on a second side of the side surface of the layered structure in the light waveguide direction; and
forming an electrode on a surface of each of the p-type layer and the n-type layer.

10. The method according to claim 9, wherein the width of the Si waveguide core is equal to or greater than 0.2 µm and equal to or less than 1 µm.

11. The method according to claim 9, wherein the width of at least a portion of the Si waveguide core increases toward the light waveguide direction.

12. The method according to claim 9, wherein a thickness of the Si waveguide core is equal to or greater than 100 nm and equal to or less than 300 nm.

13. The method according to claim 9, wherein a width of the i-type core layer is equal to or greater than 200 nm and equal to or less than 800 nm.

14. The method according to claim 9, wherein a thickness of the i-type core layer is equal to or greater than 50 nm and equal to or less than 160 nm.

15. The method according to claim 9, wherein:
the first i-type waveguide clad and the second i-type waveguide clad comprise i-type InP;

the p-type layer comprises a p-type InP and a p-type InGaAs that is lattice-matched to InP;

the n-type layer comprises an n-type InP and an n-type InGaAs that is lattice-matched to InP; and the i-type core layer absorbs light in a long wavelength band.

16. The method according to claim 15, wherein the i-type core layer comprises InGaAs or InGaAsP.

* * * * *